United States Patent
Mayer et al.

(10) Patent No.: US 9,086,442 B2
(45) Date of Patent: Jul. 21, 2015

(54) METHODS AND APPARATUS TO DETECT LEAKAGE CURRENT IN A RESISTANCE TEMPERATURE DETECTOR

(71) Applicant: Bristol, Inc., Watertown, CT (US)

(72) Inventors: Paul Gerard Mayer, Sandy Hook, CT (US); Jeffrey Barry McGaughey, Rocky Hill, CT (US); Xuedong Liu, Avon, CT (US)

(73) Assignee: BRISTOL, INC., Watertown, CT (US)

( * ) Notice: Subject to any disclaimer, the term of this patent is extended or adjusted under 35 U.S.C. 154(b) by 124 days.

(21) Appl. No.: 13/888,018

(22) Filed: May 6, 2013

(65) Prior Publication Data

US 2013/0293241 A1    Nov. 7, 2013

Related U.S. Application Data

(60) Provisional application No. 61/643,516, filed on May 7, 2012.

(51) Int. Cl.
| | |
|---|---|
| *G01R 31/14* | (2006.01) |
| *G01R 31/02* | (2006.01) |
| *G01K 19/00* | (2006.01) |
| *G01K 7/16* | (2006.01) |
| *G01K 15/00* | (2006.01) |

(52) U.S. Cl.
CPC .............. *G01R 31/025* (2013.01); *G01K 7/16* (2013.01); *G01K 19/00* (2013.01); *G01K 15/007* (2013.01)

(58) Field of Classification Search
CPC .............................. G01R 31/025; G01R 31/02
USPC .................... 324/500, 510, 713, 715
See application file for complete search history.

(56) References Cited

U.S. PATENT DOCUMENTS

| | | | |
|---|---|---|---|
| 5,469,071 A | 11/1995 | Obata | |
| 5,876,122 A * | 3/1999 | Eryurek | 374/183 |
| 2011/0057707 A1* | 3/2011 | Bronczyk et al. | 327/332 |
| 2013/0038340 A1* | 2/2013 | Masuda | 324/713 |

FOREIGN PATENT DOCUMENTS

| | | |
|---|---|---|
| JP | H0454421 | 2/1992 |
| JP | H10307066 | 11/1998 |
| JP | 2000253565 A * | 9/2000 |

OTHER PUBLICATIONS

Patent Cooperation Treaty, "International Preliminary Report on Patentability," issued in connection with Application No. PCT/US2013/039817, Nov. 11, 2014, 8 pages.

Patent Cooperation Treaty, "International Search Report," issued in connection with Application No. PCT/ US2013/039817, Mar. 3, 2014, 2 pages.

Patent Cooperation Treaty, "Written Opinion of the International Searching Authority," issued in connection with Application No. PCT/US2013/039817, Mar. 3, 2014, 7 pages.

* cited by examiner

*Primary Examiner* — Melissa Koval
*Assistant Examiner* — Daniel Miller
(74) *Attorney, Agent, or Firm* — Hanley, Flight & Zimmerman, LLC

(57) ABSTRACT

Methods and apparatus to detect leakage current in a resistance temperature detector are disclosed. An example method includes providing a resistance temperature detector circuit with a first resistance circuit and a second resistance circuit, measuring a first voltage at the first resistance circuit in response to applying a first current to the first resistance circuit, measuring a second voltage at the second resistance in response to applying a second current to the second resistance circuit, comparing the first and second voltages to determine a difference value, and determining that a current leak exists in the resistance temperature detector circuit when the difference value is not within a first range.

24 Claims, 5 Drawing Sheets

METHODS AND APPARATUS TO DETECT LEAKAGE CURRENT IN A RESISTANCE TEMPERATURE DETECTOR

RELATED APPLICATIONS

This patent claims priority to U.S. Provisional Application No. 61/643,516, filed on May 7, 2012, the entirety of which is hereby incorporated by reference.

FIELD OF THE DISCLOSURE

The disclosure relates generally to temperature detection and, more particularly, to methods and apparatus to detect leakage current in a resistance temperature detector.

BACKGROUND

In a process control system, when calculating the flow of gas in a pipeline using an orifice plate method, it is important to have an accurate temperature measurement for use in calculation. RTD (resistance temperature detector) circuits are used to accurately determine temperature.

SUMMARY

An example method includes providing a resistance temperature detector circuit with a first resistance and a second resistance, measuring a first voltage across the first resistance in response to applying a current to the first resistance, measuring a second voltage across the second resistance in response to applying a second current to the second resistance, comparing the first and second voltages to determine a difference value, and determining that a current leak exists in the resistance temperature detector circuit when the difference value is not within a first range.

DETAILED DESCRIPTION

Although the following discloses example systems including, among other components, software and/or firmware executed on hardware, it should be noted that such systems are merely illustrative and should not be considered as limiting. For example, it is contemplated that any or all of these hardware, software, and firmware components could be embodied exclusively in hardware, exclusively in software, or in any combination of hardware and software. Accordingly, while the following describes example systems, persons of ordinary skill in the art will readily appreciate that the examples provided are not the only way to implement such systems.

The accuracy of RTD circuits may be compromised by electrical current leakage into or out of the circuit measuring the resistance. In such cases, the measurements are inaccurate and, thus, the calculated temperature is inaccurate. A change in temperature by one degree Celsius can result in a 0.5% error in gas flow calculated. Some applications require temperature measurement accuracies equal to or better than one degree Celsius. For example, custody transfer stations are a prime application for this kind of accuracy requirement.

If an RTD wire is shorted and/or there is water in the wiring conduit, known approaches may only indicate a change in resistance, and may not indicate a failure until an output is off-scale (e.g., there is a gross error). However, example methods and apparatus disclosed herein detect leakages as small as one microampere ($\mu A$), which represents an error of approximately 0.04%. Thus, example methods and apparatus described below reduce or prevent errant calculations of gas flow before the errors become significant. Example methods and apparatus disclosed herein may also be used to detect water present on the circuitry or connections. The example methods and apparatus may also enable errant leakage current to be measured and, thus, to be used to correct a faulty gas flow measurement in real time (e.g., without physical correction).

Figure 1:
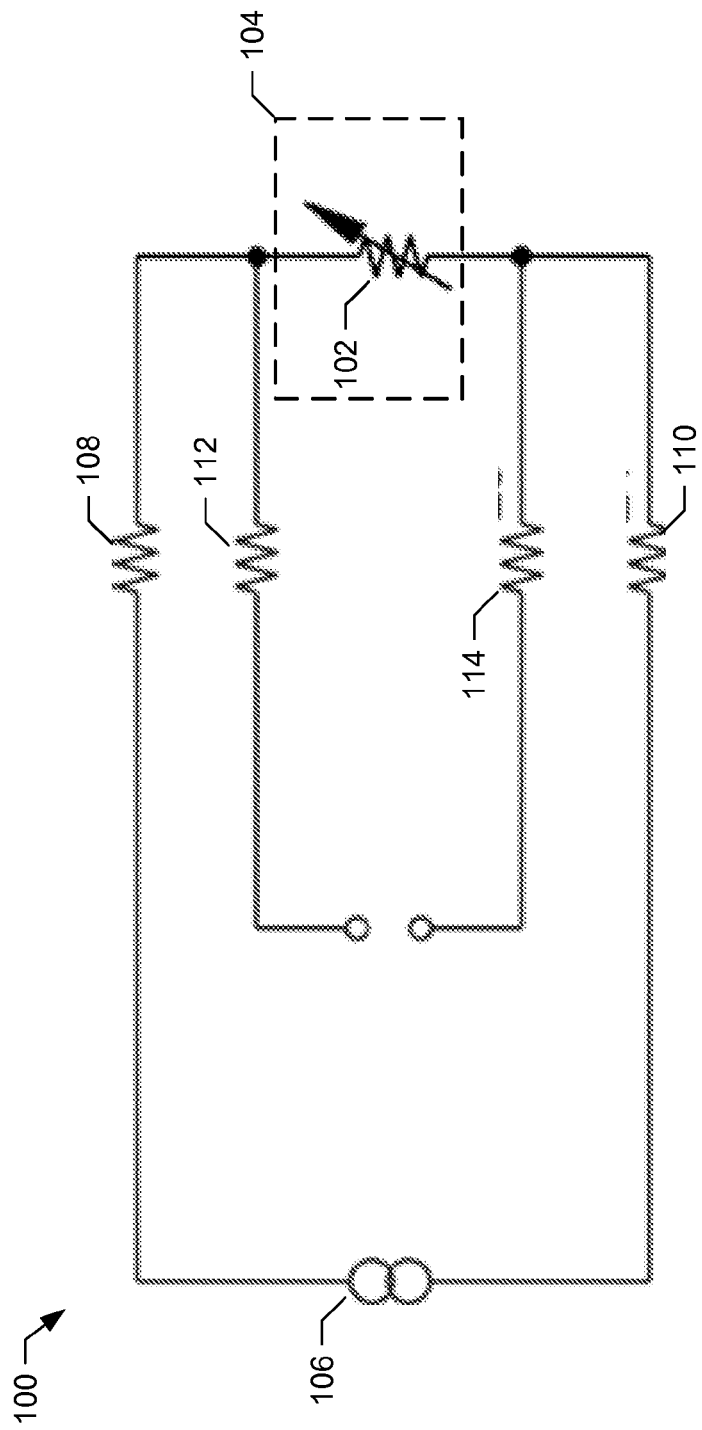
FIG. 1 is a circuit diagram of a known 4-wire resistance temperature detector.

FIG. 1 is a circuit diagram of a known 4-wire resistance temperature detector (RTD) circuit 100. The RTD circuit 100 includes a resistor 102 having temperature-variable resistance. The resistor 102 is placed into an environment 104 to be measured, and the resistor 102 assumes substantially the same temperature as the environment. A current source 106 generates a current through the resistor 102 (e.g., via resistors 108, 110). A voltage across the resistor 102 may then be measured (e.g., via resistors 112, 114) to determine the resistance of the resistor 102 and, thus, the temperature of the resistor 102 and the environment 104.

Figure 2:
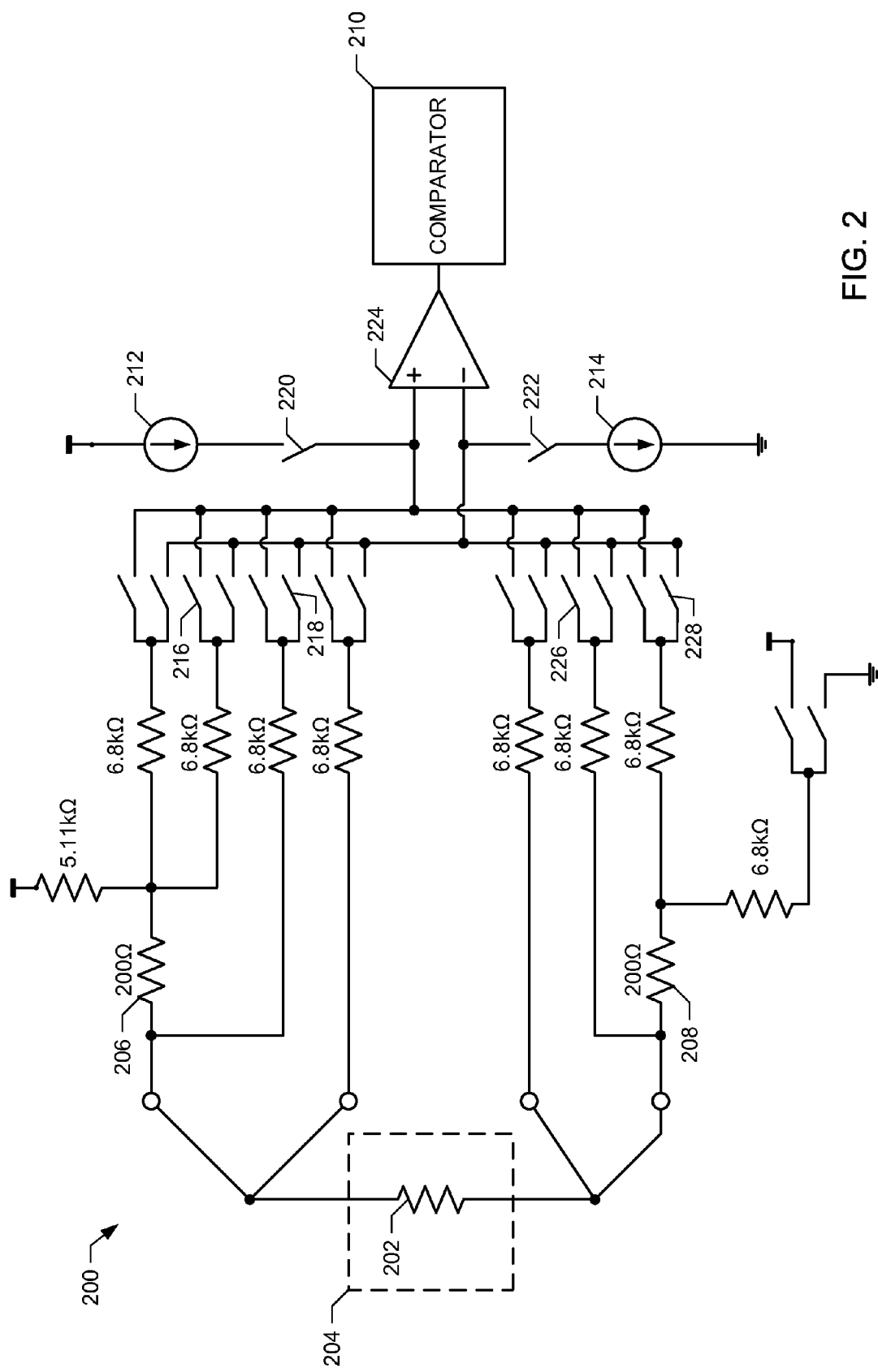
FIG. 2 is a circuit diagram of an example resistance temperature detector constructed in accordance with the teachings of this disclosure.

FIG. 2 is a circuit diagram of an example resistance temperature detector circuit 200 to detect leakage current. In contrast to the known RTD circuit 100 of FIG. 1, the example RTD circuit 200 of FIG. 2 may be used to identify current leaks into or out of the circuit (e.g., in a process control environment).

The example RTD circuit 200 of FIG. 2 includes a resistor 202 located in an environment 204 to be measured. The example RTD circuit 200 further includes a first sense resistor 206, a second sense resistor 208, and a comparator 210. To monitor both sides of the example resistor 202, the example sense resistors 206, 208 are in circuit with the resistor 202 on opposite ends of the resistor 202. The example comparator 210 measures the voltage across the first sense resistor 206 in response to a known current (e.g., from current sources 212, 214) flowing through the resistor 206. The comparator 210 also measures the voltage across the second sense resistor 208 in response to the same known current flowing through the second sense resistor 208.

To take the measurements, example switches 216 and 218 (and test current switches 220 and 222) are closed to cause a test current to flow through the example first sense resistor 206. The example comparator 210 measures the output via an amplifier 224. The example switches 216 and 218 are then opened and switches 226 and 228 are closed to cause a test current to flow through the example second sense resistor 208. The comparator measures the output via the amplifier 224. The comparator 210 may then compare the measurements.

After taking the measurements, the example comparator 210 compares the measurements to determine whether a difference between the measurements is within an expected range (e.g., whether the measurements are substantially equal). For example, the first and second sense resistors 206, 208 may be high-precision resistors having the same target (e.g., nominal) resistance value. In that case, if the currents flowing through the first and second sense resistors 206, 208 are equal or substantially equal, the measurements taken by the comparator 210 should have a difference not greater than a threshold corresponding to the potential compound error in the resistance values and/or the applied current(s).

In some other examples, the first and second sense resistors 206, 208 may be high precision resistors having different target (e.g., nominal) resistance values. In such examples, the comparator 210 determines whether the difference in the measurement is within a range of an expected difference. The range may be based on, for example, the potential compound error in the resistance values and/or the applied current(s).

If the comparator 210 determines that the difference between the measurements is not within an expected range (or is greater than a threshold), the example comparator 210 outputs an alert (e.g., a flag) signaling the presence of a potential electrical shorting or leakage condition in the RTD circuit 200. In some examples, the comparator 210 controls the switches 216-222, 226, and 228, the amplifier 224, and/or the current sources 212, 214.

The example comparator 210, the example switches 216-222, 226, and 228, and the example amplifier 224 of FIG. 2 may be implemented by hardware, software, firmware and/or any combination of hardware, software and/or firmware. Thus, for example, the example comparator 210, the example switches 216-222, 226, and 228, and/or the example amplifier 224 of FIG. 2 could be implemented by one or more circuit(s), programmable processor(s), application specific integrated circuit(s) (ASIC(s)), programmable logic device(s) (PLD(s)) and/or field programmable logic device(s) (FPLD(s)), etc. Further still, the example comparator 210, the example switches 216-222, 226, and 228, and/or the example amplifier 224 may include one or more elements, processes and/or devices in addition to, or instead of, those illustrated in FIG. 2, and/or may include more than one of any or all of the illustrated elements, processes and devices.

Figure 3:
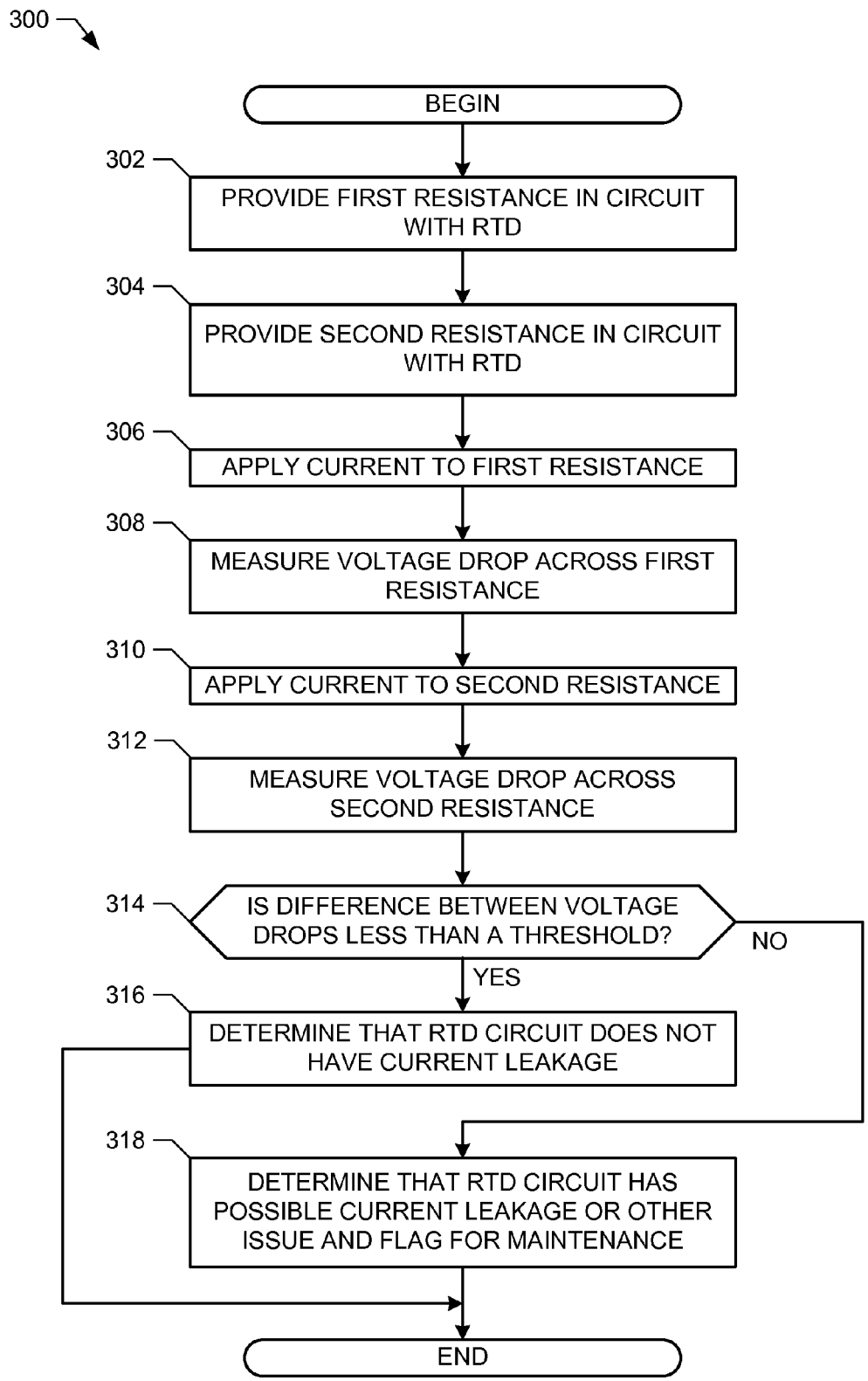
FIG. 3 is a flowchart illustrating an example method to detect leakage current in a resistance temperature detector circuit.
Figure 4:
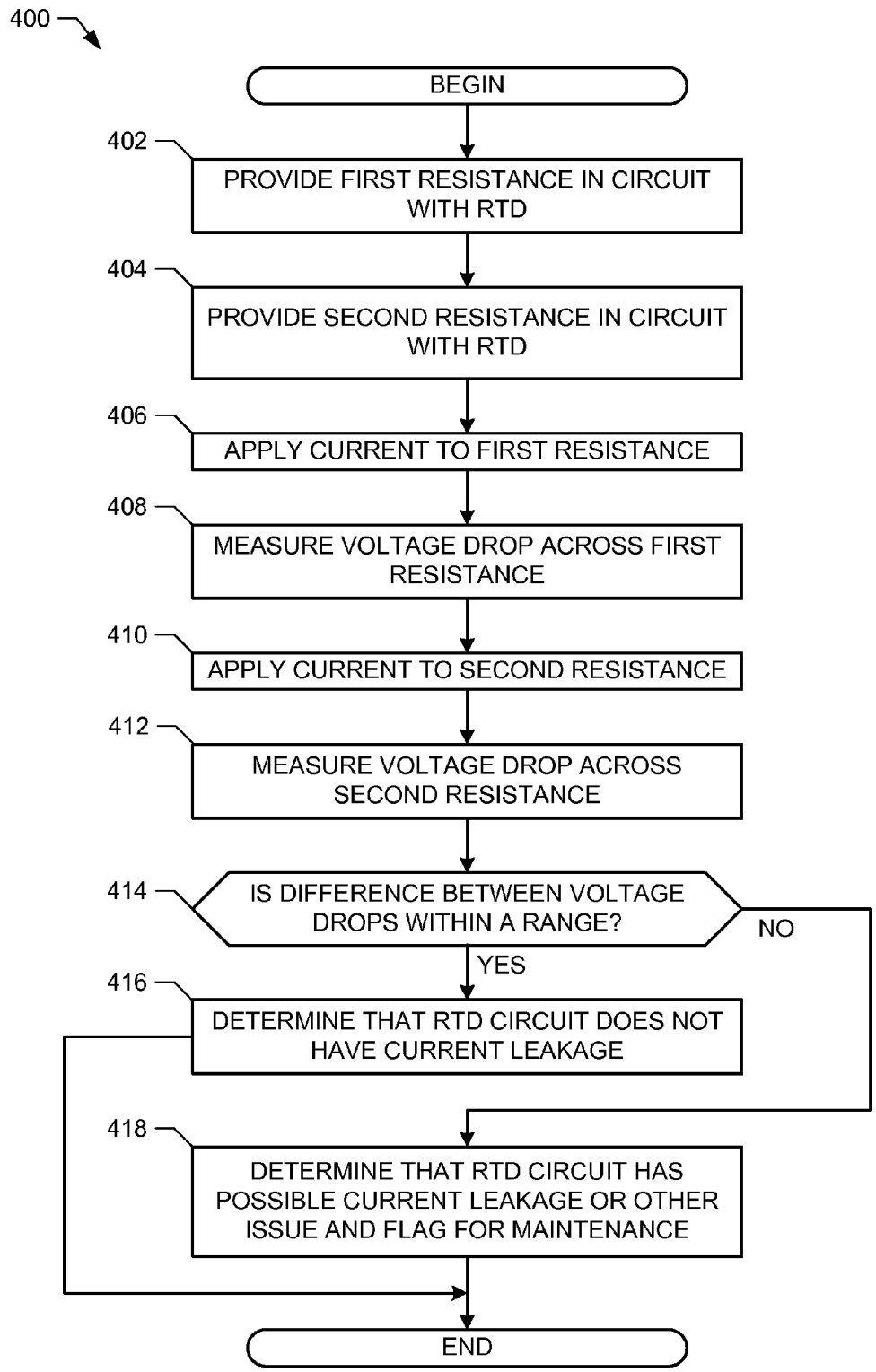
FIG. 4 is a flowchart illustrating another example method to detect leakage current in a resistance temperature detector circuit.

A flowchart representative of an example method to implement any of the example comparator 210, the example switches 216-222, 226, and 228, and/or the example amplifier 224 are shown in FIGS. 3-4. In this example, the method may be implemented using machine readable instructions comprising a program for execution by a processor such as the processor 512 shown in the example computer 500 discussed below in connection with FIG. 5. The program may be embodied in software stored on a tangible computer readable medium such as a computer readable storage medium (e.g., a CD-ROM, a floppy disk, a hard drive, a digital versatile disk (DVD), a Blu-ray disk, or a memory associated with the processor 512), but the entire program and/or parts thereof could alternatively be executed by a device other than the processor 512 and/or embodied in firmware or dedicated hardware. Further, although the example program is described with reference to the flowchart illustrated in FIGS. 3-4, many other methods of implementing the example comparator 210, the example switches 216-222, 226, and 228, and/or the example amplifier 224 may alternatively be used. For example, the order of execution of the blocks may be changed, and/or some of the blocks described may be changed, eliminated, or combined.

As mentioned above, the example method of FIGS. 3-4 may be implemented using coded instructions (e.g., computer readable instructions) stored on a tangible computer readable medium such as a hard disk drive, a flash memory, a read-only memory (ROM), a compact disk (CD), a digital versatile disk (DVD), a cache, a random-access memory (RAM) and/or any other storage media in which information is stored for any duration (e.g., for extended time periods, permanently, brief instances, for temporarily buffering, and/or for caching of the information). As used herein, the term tangible computer readable medium is expressly defined to include any type of computer readable storage and to exclude propagating signals. Additionally or alternatively, the example method of FIGS. 3-4 may be implemented using coded instructions (e.g., computer readable instructions) stored on a non-transitory computer readable medium such as a hard disk drive, a flash memory, a read-only memory, a compact disk, a digital versatile disk, a cache, a random-access memory and/or any other storage media in which information is stored for any duration (e.g., for extended time periods, permanently, brief instances, for temporarily buffering, and/or for caching of the information). As used herein, the term non-transitory computer readable medium is expressly defined to include any type of computer readable medium and to exclude propagating signals.

FIG. 3 is a flowchart illustrating an example method 300 to detect leakage current in an RTD circuit. The example method 300 may be implemented by the comparator 210 of FIG. 2 to detect leakage in the RTD circuit 200 of FIG. 2 and/or by a user (e.g., a technician, an installer) of the RTD circuit 200. The example method 300 may be used if, for example, substantially equal resistances are installed in the RTD circuit to implement the first and second resistances.

The example method 300 begins with providing a first resistance (e.g., the sense resistor 206 of FIG. 2) in circuit with the RTD circuit 200 (e.g., in circuit with the resistor 202) (block 302). A second resistance (e.g., the sense resistor 208 of FIG. 2) is also provided in circuit with the RTD circuit 200 (e.g., in circuit with the resistor 202) (block 304). In the example method 300, the first and second resistances may be provided on opposite sides of the RTD circuit 200.

A current is applied to the first resistance (e.g., the sense resistor 206) (block 306). The example comparator 210 measures a voltage drop across the first resistance (block 308). A current is applied to the second resistance (e.g., the sense resistor 208) (block 310). The example comparator 210 measures a voltage drop across the second resistance (block 312).

The example comparator 210 determines whether a difference between the first and second voltage drops is less than a threshold (block 314). If the difference is less than a threshold (block 314), the example comparator 210 determines that the RTD circuit 200 does not have current leakage (block 314). Conversely, if the difference between the voltage drops is not less than the threshold (block 314), the example comparator 210 determines that the RTD circuit 200 has a possible current leakage or other issue, and raises a flag or alert for maintenance (block 318).

After determining that the RTD circuit 200 does not have leakage (block 316) or does have leakage (block 318), the example method 300 of FIG. 3 ends. In some examples, the comparator 210 proceeds to measure a temperature via the resistor 202 after determining in block 316 that the RTD circuit 200 does not have leakage.

FIG. 4 is a flowchart illustrating another example method 400 to detect leakage current in an RTD circuit. The example method 400 may be implemented by the comparator 210 of FIG. 2 to detect leakage in the RTD circuit 200 of FIG. 2 and/or by a user (e.g., a technician, an installer) of the RTD circuit 200. The example method 400 may be used if, for example, different resistances are installed in the RTD circuit to implement the first and second resistances.

The example method 400 begins with providing a first resistance (e.g., the sense resistor 206 of FIG. 2) in circuit with the RTD circuit 200 (e.g., in circuit with the resistor 202) (block 402). A second resistance (e.g., the sense resistor 208 of FIG. 2) is also provided in circuit with the RTD circuit 200 (e.g., in circuit with the resistor 202) (block 404). In the example method 400, the first and second resistances may be provided on opposite sides of the RTD circuit 200.

A current is applied to the first resistance (e.g., the sense resistor 206) (block 406). The example comparator 210 measures a voltage drop across the first resistance (block 408). A current is applied to the second resistance (e.g., the sense resistor 208) (block 410). The example comparator 210 measures a voltage drop across the second resistance (block 412).

The example comparator 210 determines whether a difference between the first and second voltage drops is within a range (block 414). If the difference is within a range (block 414), the example comparator 210 determines that the RTD circuit 200 does not have current leakage (block 414). Conversely, if the difference between the voltage drops is not within the range (block 414), the example comparator 210 determines that the RTD circuit 200 has a possible current leakage or other issue, and raises a flag or alert for maintenance (block 418).

After determining that the RTD circuit 200 does not have leakage (block 416) or does have leakage (block 418), the example method 400 of FIG. 4 ends. In some examples, the comparator 210 proceeds to measure a temperature via the resistor 202 after determining in block 416 that the RTD circuit 200 does not have leakage.

Figure 5:
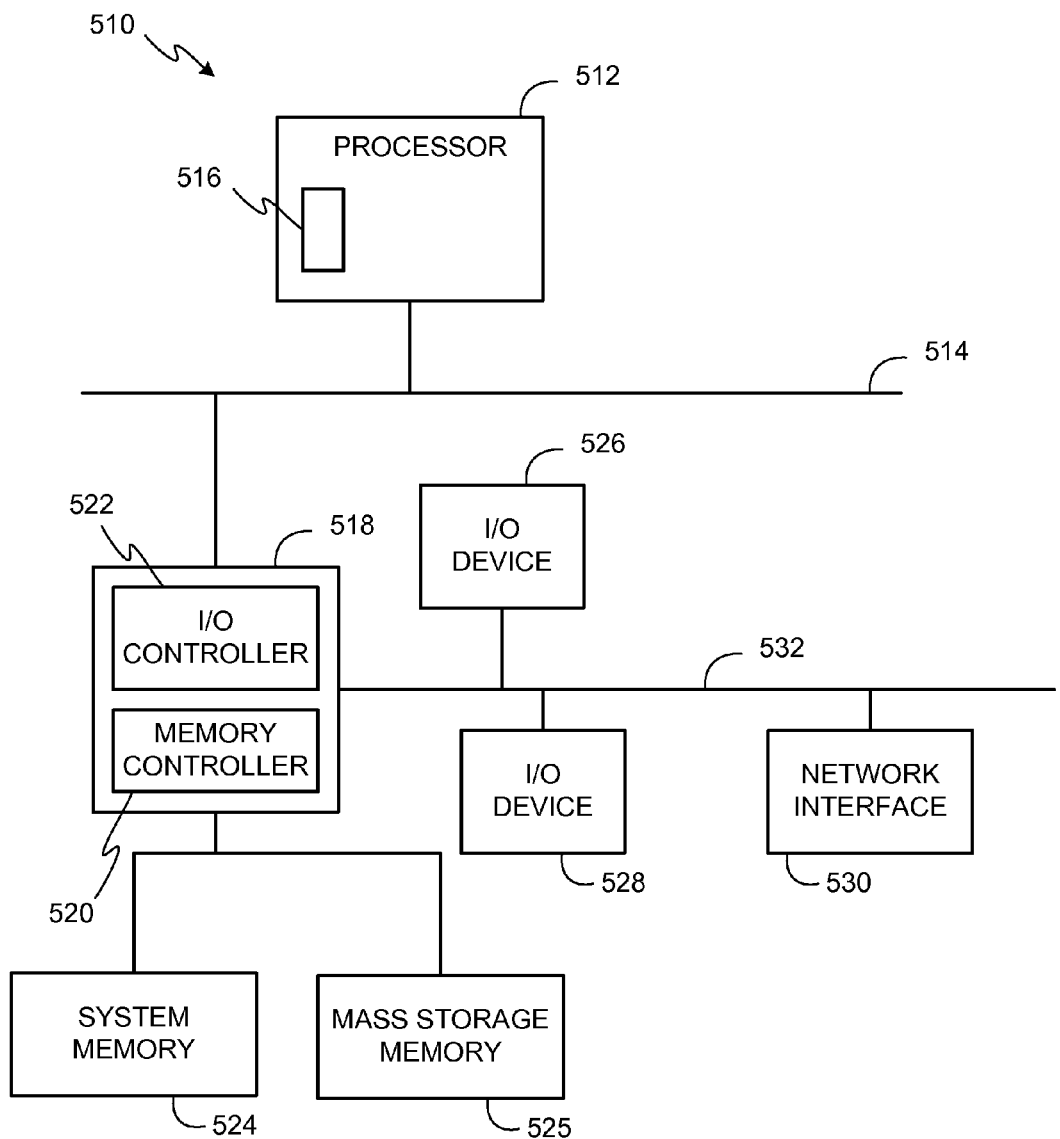
FIG. 5 is a block diagram of an example processor system that may be used to implement the example detector of FIG. 1.

FIG. 5 is a block diagram of an example processor system 510 that may be used to implement the example comparator 210, the example switches 216-222, 226, and 228, and/or the example current sources 212, 214 of FIG. 2. As shown in FIG. 5, the processor system 510 includes the processor 512 that is coupled to an interconnection bus 514. The processor 512 includes a register set or register space 516, which is depicted in FIG. 5 as being entirely on-chip, but which could alternatively be located entirely or partially off-chip and directly coupled to the processor 512 via dedicated electrical connections and/or via the interconnection bus 514. The processor 512 may be any suitable processor, processing unit or microprocessor. Although not shown in FIG. 5, the system 510 may be a multi-processor system and, thus, may include one or more additional processors that are identical or similar to the processor 512 and that are communicatively coupled to the interconnection bus 514.

The processor 512 of FIG. 5 is coupled to a chipset 518, which includes a memory controller 520 and an input/output (I/O) controller 522. As is well known, a chipset typically provides I/O and memory management functions as well as a plurality of general purpose and/or special purpose registers, timers, etc. that are accessible or used by one or more processors coupled to the chipset 518. The memory controller 520 performs functions that enable the processor 512 (or processors if there are multiple processors) to access a system memory 524 and a mass storage memory 525.

The system memory 524 may include any desired type of volatile and/or non-volatile memory such as, for example, static random access memory (SRAM), dynamic random access memory (DRAM), flash memory, read-only memory (ROM), etc. The mass storage memory 525 may include any desired type of mass storage device including hard disk drives, optical drives, tape storage devices, etc.

The I/O controller 522 performs functions that enable the processor 512 to communicate with peripheral input/output (I/O) devices 526 and 528 and a network interface 530 via an I/O bus 532. The I/O devices 526 and 528 may be any desired type of I/O device such as, for example, a keyboard, a video display or monitor, a mouse, etc. The example switches 218-222, 226, and/or 228 and/or the example current sources 212, 214 of FIG. 2 may be implemented and/or controlled by the I/O devices 526 and 528. The network interface 530 may be, for example, an Ethernet device, an asynchronous transfer mode (ATM) device, an 802.11 device, a DSL modem, a cable modem, a cellular modem, etc. that enables the processor system 510 to communicate with another processor system.

While the memory controller 520 and the I/O controller 522 are depicted in FIG. 5 as separate functional blocks within the chipset 518, the functions performed by these blocks may be integrated within a single semiconductor circuit or may be implemented using two or more separate integrated circuits.

Although certain example methods, apparatus and articles of manufacture have been disclosed herein, the scope of coverage of this patent is not limited thereto. On the contrary, this patent covers all methods, apparatus and articles of manufacture fairly falling within the scope of the claims of this patent.

What is claimed is:

1. A method, comprising:
   providing a resistance temperature detector circuit with a first resistance circuit and a second resistance circuit;
   measuring a first voltage at the first resistance circuit in response to applying a first current to the first resistance circuit;
   measuring a second voltage at the second resistance in response to applying a second current to the second resistance circuit;
   comparing the first and second voltages to determine a difference value; and
   determining that a current leak exists in the resistance temperature detector circuit when the difference value is not within a first range.

2. A method as defined in claim 1, further comprising issuing an alert or flag when the difference value is not within the first range.

3. A method as defined in claim 1, further comprising:
   calculating a gas flow measurement based on a temperature measured via the resistance temperature detector; and
   correcting the gas flow measurement in substantially real time when the difference value is not within the first range.

4. A method as defined in claim 1, further comprising measuring a temperature via the resistance temperature detector when the difference value is within the first range.

5. A method as defined in claim 1, wherein the first resistance circuit and the second resistance circuit have substantially equal resistance values and the first current is substantially equal to the second current.

6. A method as defined in claim 5, wherein the first range corresponds to a compound error in at least one of the resistance values or the first and second currents.

7. A method as defined in claim 1, wherein the first resistance circuit and the second resistance circuit have different resistance values.

8. A method as defined in claim 1, wherein the first resistance circuit and the second resistance circuit are coupled to opposite terminals of the resistance temperature detector circuit.

9. A method as defined in claim 1, wherein the current leak corresponds to one microampere of leakage or greater.

10. A method as defined in claim 1, further comprising:
applying the first current to the first resistance circuit during a first period of time; and
applying the second current to the second resistance circuit during a second period of time different than the first period of time.

11. An apparatus comprising:
a resistance temperature detector circuit to measure a temperature of an environment;
a first resistance circuit;
a second resistance circuit; and
a comparator to determine a difference value corresponding to a comparison of a first voltage drop across the first resistance circuit under an applied current with a second voltage drop across the second resistance circuit under the applied current and to determine whether a current leak exists in the resistance temperature detector circuit based on the difference value.

12. An apparatus as defined in claim 11, wherein the first resistance circuit and the second resistance circuit are coupled to opposite terminals of the resistance temperature detector circuit.

13. An apparatus as defined in claim 11, wherein the comparator is to issue an alert or flag when the difference value is not within a first range.

14. An apparatus as defined in claim 11, wherein the first resistance circuit and the second resistance circuit have substantially equal resistance values.

15. An apparatus as defined in claim 11, wherein the first resistance circuit and the second resistance circuit have different resistance values.

16. An apparatus as defined in claim 11, wherein the current leak corresponds to at least one microampere of leakage.

17. An apparatus as defined in claim 11, wherein the comparator measures the first voltage drop at a first time and the second voltage drop at a second time different than the first time.

18. A tangible machine readable storage medium comprising machine readable instructions, which when executed, cause a machine to at least:
measure a first voltage at a first resistance circuit coupled to a resistance temperature detector circuit, measuring the first voltage being in response to applying a first current to the first resistance circuit;
measure a second voltage at a second resistance circuit coupled to the resistance temperature detector circuit, measuring the second voltage being in response to applying a second current to the second resistance circuit;
compare the first and second voltages to determine a difference value; and
determine whether a current leak exists in the resistance temperature detector circuit based on whether the difference value is within a first range.

19. A storage medium as defined in claim 18, wherein the instructions are further to cause the machine to issue an alert or flag when the difference value is not within the first range.

20. A storage medium as defined in claim 18, wherein the instructions are further to cause the machine to measure a temperature via the resistance temperature detector when the difference value is within the first range.

21. A storage medium as defined in claim 18, wherein the first resistance circuit and the second resistance circuit have substantially equal resistance values and the first current is substantially equal to the second current.

22. A storage medium as defined in claim 21, wherein the first range corresponds to a compound error in at least one of the resistance values or the first and second currents.

23. A storage medium as defined in claim 18, wherein the first resistance circuit and the second resistance circuit have different resistance values.

24. A storage medium as defined in claim 18, wherein the first resistance circuit and the second resistance circuit are coupled to opposite terminals of the resistance temperature detector circuit.

* * * * *